(12) United States Patent
Ajioka

(10) Patent No.: US 8,101,339 B2
(45) Date of Patent: Jan. 24, 2012

(54) PHOTOSENSITIVE RESIN COMPOSITION, PHOTOSENSITIVE ELEMENT COMPRISING THE SAME, METHOD OF FORMING RESIST PATTERN, AND PROCESS FOR PRODUCING PRINTED WIRING BOARD

(75) Inventor: Yoshiki Ajioka, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 331 days.

(21) Appl. No.: 12/091,692

(22) PCT Filed: Oct. 20, 2006

(86) PCT No.: PCT/JP2006/320947
§ 371 (c)(1),
(2), (4) Date: Aug. 18, 2009

(87) PCT Pub. No.: WO2007/049519
PCT Pub. Date: May 3, 2007

(65) Prior Publication Data
US 2009/0317746 A1    Dec. 24, 2009

(30) Foreign Application Priority Data

Oct. 25, 2005   (JP) ................. P2005-310058
Apr. 3, 2006   (JP) ................. P2006-101785

(51) Int. Cl.
    *G03F 7/40*     (2006.01)
    *G03F 7/027*    (2006.01)
    *G03F 7/004*    (2006.01)
(52) U.S. Cl. .................. 430/315; 430/311; 430/284.1; 430/313; 430/318
(58) Field of Classification Search .................. None
See application file for complete search history.

(56) References Cited

U.S. PATENT DOCUMENTS

| | | | |
|---|---|---|---|
| 4,328,325 A * | 5/1982 | Marquardt et al. | 525/451 |
| 5,972,565 A | 10/1999 | Dudek et al. | |
| 6,329,123 B1 * | 12/2001 | Lundy et al. | 430/284.1 |
| 7,309,559 B2 | 12/2007 | Natori et al. | |
| 2001/0044075 A1 | 11/2001 | Nishimura et al. | |
| 2004/0063025 A1 | 4/2004 | Natori et al. | |
| 2006/0209008 A1 | 9/2006 | Nihei et al. | |
| 2009/0233230 A1 | 9/2009 | Hata et al. | |
| 2009/0317746 A1 | 12/2009 | Ajioka | |
| 2010/0129752 A1 | 5/2010 | Ajioka et al. | |

FOREIGN PATENT DOCUMENTS

| | | | |
|---|---|---|---|
| CN | 1257224 A | 6/2000 | |
| CN | 1466706 A | 1/2004 | |
| CN | 1639641 A | 7/2005 | |
| CN | 1653694 A | 8/2005 | |
| EP | 1 008 910 A1 * | 6/2000 | |
| EP | 1 008 911 A | 6/2000 | |
| EP | 1 205 802 A1 | 5/2002 | |
| JP | 61-133215 A | 6/1986 | |
| JP | 1-271469 A | 10/1989 | |
| JP | 01-274469 A | 10/1989 | |

(Continued)

OTHER PUBLICATIONS

DERWeNT-Acc-No. -2008-D53345, Derwent Week 201115, abstract of WO 2007097306 A1 inventor name Kumaki pp. 5 printed out May 22, 2011.*

(Continued)

*Primary Examiner* — Cynthia Hamilton
(74) *Attorney, Agent, or Firm* — Griffin & Szipl, P.C.

(57) ABSTRACT

A photosensitive resin composition according to the invention comprises (A) a binder polymer, (B) a photopolymerizing compound with an ethylenic unsaturated group and (C) a photopolymerization initiator, wherein component (B) contains a compound represented by the following general formula (I).

[Chemical Formula 1]

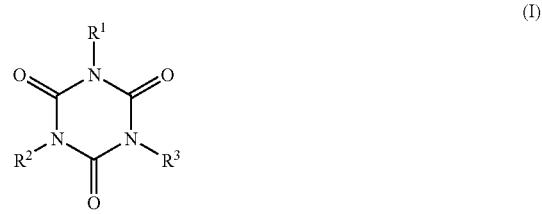

(I)

[Wherein $R^1$-$R^3$ each independently represent a group represented by the following general formula (II):

[Chemical Formula 2]

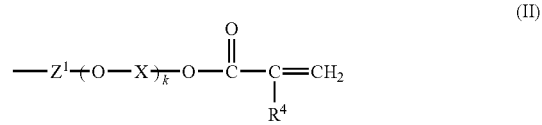

(II)

or the following general formula (III):

[Chemical Formula 3]

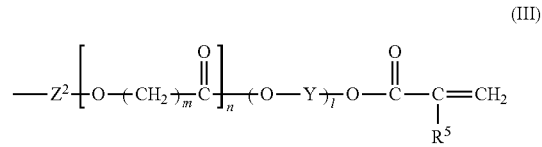

(III)

and at least one of $R^1$-$R^3$ is a group represented by general formula (III).]

2 Claims, 3 Drawing Sheets

FOREIGN PATENT DOCUMENTS

| | | |
|---|---|---|
| JP | 4-195050 A | 7/1992 |
| JP | 4-215659 A | 8/1992 |
| JP | 05-232699 A | 9/1993 |
| JP | 8-286372 A | 11/1996 |
| JP | 09-036545 A | 2/1997 |
| JP | 10-142789 A | 5/1998 |
| JP | 10-282659 A | 10/1998 |
| JP | 10-293400 A | 11/1998 |
| JP | 11-327137 A | 11/1999 |
| JP | 2000-194134 A | 7/2000 |
| JP | 2000-231190 A | 8/2000 |
| JP | 2000-241971 A | 9/2000 |
| JP | 2000-314957 A | 11/2000 |
| JP | 2000-314958 A | 11/2000 |
| JP | 2001-117224 A | 4/2001 |
| JP | 2001-154347 A | 6/2001 |
| JP | 2002-182381 A | 6/2002 |
| JP | 2003-201331 A | 7/2003 |
| JP | 2003-248308 A | 9/2003 |
| JP | 2004-144917 A | 5/2004 |
| JP | 2004-184878 A | 7/2004 |
| JP | 2004-280021 A | 10/2004 |
| JP | 2004-317851 A | 11/2004 |
| JP | 2004-317874 A | 11/2004 |
| JP | 2004-341130 A | 12/2004 |
| JP | 2005-152737 | 6/2005 |
| JP | 2005-292778 A | 10/2005 |
| JP | 2005-338375 A | 12/2005 |
| JP | 2006-154666 A | 6/2006 |
| TW | 424172 A | 3/2001 |
| TW | 200512540 | 4/2005 |
| TW | 235889 A | 7/2005 |
| WO | 01/92958 A | 12/2001 |
| WO | 2004/049070 A2 | 6/2004 |
| WO | 2007/010614 A1 | 1/2007 |
| WO | 2007/097306 A1 | 8/2007 |

OTHER PUBLICATIONS

International Search Report issued in corresponding application No. PCT/JP2006/320947, completed Nov. 6, 2006 and mailed Nov. 14, 2006.

PCT/IB/338 dated May 8, 2008 and English translation of International Preliminary Report on Patentability issued in corresponding application No. PCT/JP2006/320947.

International Search Report issued in related application PCT/JP2006/309648, completed May 29, 2006 and mailed Jun. 27, 2006.

International Search Report issued in related application PCT/JP2007/053045, completed Mar. 15, 2007 and mailed Mar. 27, 2007.

English translation of the International Preliminary Report on Patentability issued in related application PCT/JP2006/309648, mailed Dec. 21, 2007.

English translation of the International Preliminary Report on Patentability issued in related application PCT/JP2007/053045, mailed Sep. 4, 2008.

Electronics Packaging Technology, Jun. 2002, pp. 74-79, w/English abstract "[4] Outline of maskless exposure technology for spherical IC".

English translation of JP2000-231190, A (2000) from machine translation from AIPN Japan Patent Office National Center for Industrial Property Information and Training, generated Sep. 2, 2010, 11 pages.

English translation of JP2005-292778, A (2005) from machine translation from AIPN Japan Patent Office National Center for Industrial Property Information and Training, generated Sep. 2, 2010, 18 pages.

Derwent-ACC-No. 2000-621794, English abstract of JP 2000-231190 A, published Aug. 22, 2000, 6 pages.

English translation of JP2000-241971, A (2000) from machine translation from AIPN Japan Patent Office National Center for Industrial Property Information and Training, generated Sep. 2, 2010, 9 pages.

English translation of JP09-036545, A (1997) from machine translation from AIPN Japan Patent Office National Center for Industrial Property Information and Training, generated Sep. 2, 2010, 13 pages.

English translation of JP2005-338375 A (2005) from machine translation from AIPN Japan Patent Office National Center for Industrial Property Information and Training, generated Sep. 2, 2010, 35 pages.

Office Action issued in co-pending related U.S. Appl. No. 12/280,247, mailed on Sep. 15, 2010.

Office Action issued on Jun. 16, 2011 in related Chinese Patent Application No. 200780005477.7.

Office Action issued in co-pending related Japanese application No. P2008-501715 on Mar. 8, 2011 (no translation available; submitted for certification purposes).

Office Action issued in co-pending related U.S. Appl. No. 12/280,247 on Apr. 1, 2011.

Office action issued in co-pending related U.S. Appl. No. 12/280,247 on Sep. 23, 2011.

* cited by examiner

PHOTOSENSITIVE RESIN COMPOSITION, PHOTOSENSITIVE ELEMENT COMPRISING THE SAME, METHOD OF FORMING RESIST PATTERN, AND PROCESS FOR PRODUCING PRINTED WIRING BOARD

This is a National Phase Application in the United States of International Patent Application No. PCT/JP2006/320947 filed Oct. 20, 2006, which claims priority on Japanese Patent Application Nos. JP 2005-310058, filed Oct. 25, 2005, and JP 2006-101785, filed Apr. 3, 2006. The entire disclosures of the above patent applications are hereby incorporated by reference.

TECHNICAL FIELD

The present invention relates to a photosensitive resin composition, a photosensitive element employing the same, a resist pattern forming method and a printed circuit board production process.

BACKGROUND ART

Resist materials used for etching, plating and the like in the field of manufacturing conventional printed circuit boards include widely employed photosensitive resin compositions and photosensitive elements obtained by laminating these onto supports and coating them with protective films.

When a photosensitive element is used for manufacture of a printed circuit board, first the photosensitive element is laminated onto a circuit-forming board such as a copper board and subjected to pattern exposure, after which the unexposed sections of the photosensitive element are removed with a developing solution to form a resist pattern. Next, the resist pattern is used as a mask for etching or plating of the circuit-forming board on which the resist pattern has been formed, in order to form a circuit pattern, and finally the cured sections of the photosensitive element are released and removed from the board (for example, see Patent document 1).

In this type of printed circuit board production process, the developing solution used for removal of the unexposed sections of the photosensitive element can usually be any one capable of dissolving or dispersing the photosensitive resin composition layer to some extent, and from environmental and safety considerations the major alkali development types used at the current time are aqueous sodium carbonate and aqueous sodium hydrogencarbonate. Photosensitive resin compositions must exhibit excellent tenting properties that are not affected by the spray pressure of the developing solution or rinsing after exposure, or in other words, excellent "tent reliability". As photosensitive resin compositions with excellent tent reliability, there have been proposed photosensitive resin compositions comprising bifunctional or trifunctional monomers with urethane bonds (for example, see Patent documents 2-4).

[Patent document 1] Japanese Unexamined Patent Publication HEI No. 4-195050
[Patent document 2] Japanese Unexamined Patent Publication HEI No. 10-142789
[Patent document 3] International Patent Publication No. WO01/092958
[Patent document 4] Japanese Unexamined Patent Publication No. 2001-117224

DISCLOSURE OF THE INVENTION

Problems to be Solved by the Invention

When using photosensitive resin compositions comprising bifunctional monomers with urethane bonds, however, the tent reliability is not always satisfactory, and when using photosensitive resin compositions comprising trifunctional monomers with urethane bonds, the obtained cured films are hard and brittle.

The present invention has been completed in light of the circumstances described above, and its object is to provide a photosensitive resin composition with excellent tent reliability allowing formation of cured films with sufficient mechanical strength and flexibility, as well as a photosensitive element employing the same, resist pattern forming method and printed circuit board production process.

Means for Solving the Problems

In order to achieve the object stated above, the invention provides a photosensitive resin composition comprising (A) a binder polymer, (B) a photopolymerizing compound with at least one polymerizable ethylenic unsaturated group in the molecule and (C) a photopolymerization initiator, wherein component (B) contains a compound represented by the following general formula (I).

[Chemical Formula 1]

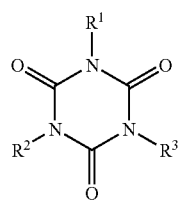

(I)

[In formula (I), $R^1$, $R^2$ and $R^3$ each independently represent a group represented by the following general formula (II):

[Chemical Formula 2]

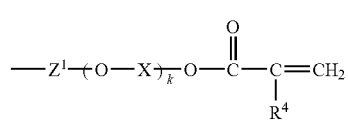

(II)

(wherein $R^4$ represents hydrogen or methyl, X represents C2-6 alkylene, $Z^1$ represents a single bond or divalent organic group and k represents an integer of 1-30), or a group represented by the following general formula (III):

[Chemical Formula 3]

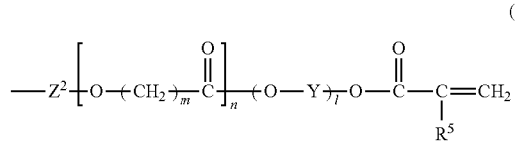

(III)

(wherein $R^5$ represents hydrogen or methyl, $Z^2$ represents a single bond or divalent organic group, Y represents C2-6 alkylene, m represents an integer of 1-10, n represents an integer of 1-10 and l represents an integer of 0-10),
and at least one from among $R^1$, $R^2$ and $R^3$ is a group represented by general formula (III).]

The photosensitive resin composition of the invention comprises components (A)-(C) as essential components, and by using a compound with an isocyanuric ring backbone represented by general formula (I) as component (B) it is possible to form a cured film with sufficient mechanical strength and flexibility while achieving excellent tent reliability. Although it is not fully understood why this allows formation of cured films with sufficient mechanical strength and flexibility, it is conjectured that the presence of the group represented by general formula (III) in the compound represented by general formula (I) is an influencing factor.

In the photosensitive resin composition of the invention, preferably either or both of $Z^1$ in general formula (II) and/or $Z^2$ in general formula (III) are a divalent group represented by the following general formula (IV), (V) or (VI).

[Chemical Formula 4]

(IV)

[In formula (IV), p represents an integer of 1-10.]

[Chemical Formula 5]

(V)

[Chemical Formula 6]

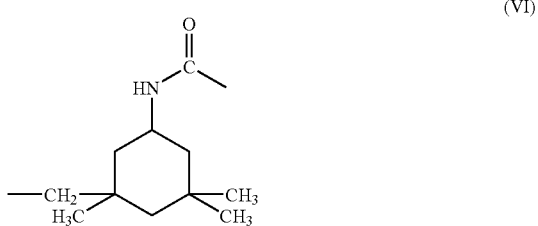

(VI)

If $Z^1$ and/or $Z^2$ are groups represented by general formulas (IV)-(VI) above, the photosensitive resin composition can exhibit even more excellent tent reliability. From the viewpoint of further improving the flexibility of the obtained cured film, $Z^1$ and/or $Z^2$ are preferably groups represented by general formula (IV).

Preferably, n in general formula (III) for the photosensitive resin composition of the invention is an integer of 2-10. If n is an integer of 2-10, it will be possible to further improve the mechanical strength and flexibility of the obtained cured film.

For the photosensitive resin composition of the invention, preferably X in general formula (II) is an ethylene or propylene group, and m in general formula (III) is an integer of 4-10. This will allow still further improvement in the mechanical strength and flexibility of the obtained cured film.

The invention also provides a photosensitive element comprising a support and a photosensitive resin composition layer composed of the photosensitive resin composition of the invention, formed on the support.

Since the photosensitive element comprises a photosensitive resin composition layer composed of the photosensitive resin composition of the invention, it can exhibit the satisfactory mechanical strength and flexibility of a cured film composed of the photosensitive resin composition layer, while also exhibiting excellent tent reliability.

The invention still further provides a resist pattern forming method wherein the aforementioned photosensitive resin composition layer in a photosensitive element of the invention is laminated on a circuit-forming board and prescribed sections of the photosensitive resin composition layer are exposed to active light rays to form exposed sections, after which the sections other than the exposed sections are removed.

The present invention further provides a process for production of a printed circuit board wherein a circuit-forming board having a resist pattern formed by the resist pattern forming method of the invention is etched or plated.

Since the resist pattern forming method and printed circuit board production process of the invention employ a photosensitive element of the invention, the excellent tent reliability of the element allows satisfactory exposure and etching or plating to be carried out even with narrow pattern spacings, so that production yield for the printed circuit board can be further increased.

Effect of the Invention

According to the invention it is possible to provide a photosensitive resin composition with excellent tent reliability allowing formation of cured films with sufficient mechanical strength and flexibility, as well as a photosensitive element employing the same, resist pattern forming method and printed circuit board production process.

EXPLANATION OF SYMBOLS

Figure 1:
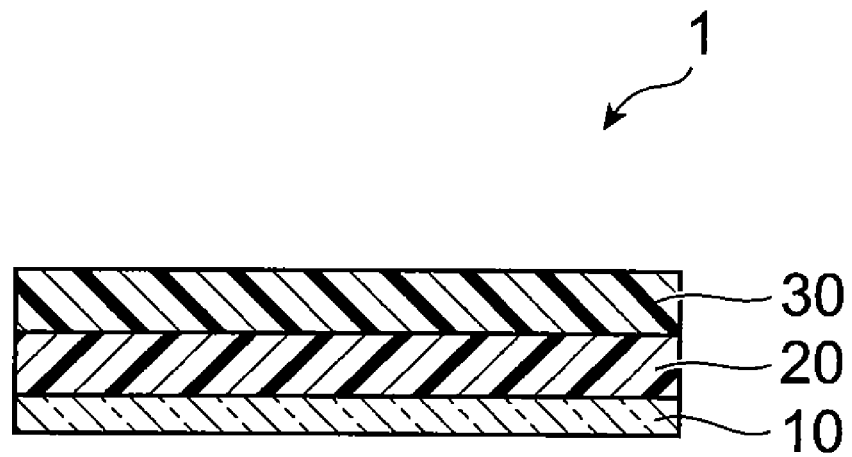
FIG. 1 is a schematic view of the cross-sectional structure of a photosensitive element according to an embodiment.

1: Photosensitive element, 10: support, 20: photosensitive resin composition layer, 30: protective film, 40: hole tear counting board, 41: round hole, 42: three continuous holes, 43: copper clad laminate.

BEST MODE FOR CARRYING OUT THE INVENTION

Preferred embodiments of the invention will now be explained in detail, with reference to the accompanying drawings as necessary. Identical or corresponding parts in the drawings will be referred to by like reference numerals and will be explained only once. The term "(meth)acrylic acid" used throughout the explanation that follows means acrylic acid and its corresponding methacrylic acid, (meth)acrylate means acrylate and its corresponding methacrylate, and (meth)acryloyl group means acryloyl and its corresponding methacryloyl group.

(Photosensitive Resin Composition)

The photosensitive resin composition of the invention comprises (A) a binder polymer (hereinafter also referred to as "component (A)"), (B) a photopolymerizing compound having at least one polymerizable ethylenic unsaturated group in the molecule (hereinafter also referred to as "component (B)") and (C) a photopolymerization initiator (hereinafter also referred to as "component (C)"), and it contains a compound with a specific isocyanuric ring backbone as component (B).

Component (A), component (B) and component (C) will now be explained in further detail.

As examples for the binder polymer as component (A) there may be mentioned acrylic-based resins, styrene-based resins, epoxy-based resins, amide-based resins, amide/epoxy-based resins, alkyd-based resins and phenol-based resins. Acrylic-based resins are preferably used for their superior alkali development properties. These may be used alone or in combinations of two or more.

The (A) binder polymer may be produced, for example, by radical polymerization of a polymerizable monomer. As examples for the polymerizable monomer there may be mentioned styrene, polymerizable styrene derivatives substituted at the α-position or aromatic ring such as vinyltoluene and α-methylstyrene, acrylamides such as diacetoneacrylamide, acrylonitrile, vinyl alcohol esters such as vinyl-n-butyl ether, (meth)acrylic acid alkyl esters, (meth)acrylic acid tetrahydrofurfuryl ester, (meth)acrylic acid dimethylaminoethyl ester, (meth)acrylic acid diethylaminoethyl ester, (meth)acrylic acid glycidyl ester, 2,2,2-trifluoroethyl(meth)acrylate, 2,2,3,3-tetrafluoropropyl(meth)acrylate, (meth)acrylic acid, α-bromo(meth)acrylic acid, α-chloro(meth)acrylic acid, β-furyl(meth)acrylic acid, β-styryl(meth)acrylic acid, maleic acid, maleic anhydride, maleic acid monoesters such as monomethyl malate, monoethyl malate and monoisopropyl malate, and fumaric acid, cinnamic acid, α-cyanocinnamic acid, itaconic acid, crotonic acid, propiolic acid and the like. Two or more of the above may also be used in combination as the (A) binder polymer.

As examples of (meth)acrylic acid alkyl esters there may be mentioned compounds represented by the following general formula (VII), and the same compounds with the alkyl groups substituted with hydroxyl, epoxy, halogens or the like.

[Chemical Formula 7]

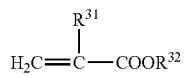

(VII)

[In formula (VII), $R^{31}$ represents hydrogen or methyl and $R^{32}$ represents a C1-12 alkyl group.]

As examples of groups represented by $R^{32}$ in general formula (VII) above there may be mentioned methyl, ethyl, propyl, butyl, pentyl, hexyl, heptyl, octyl, nonyl, decyl, undecyl, dodecyl and their structural isomers.

More specifically, as examples of compounds represented by general formula (VII) there may be mentioned methyl (meth)acrylate, ethyl(meth)acrylate, propyl(meth)acrylate, butyl(meth)acrylate, pentyl(meth)acrylate, hexyl(meth)acrylate, heptyl(meth)acrylate, octyl(meth)acrylate, 2-ethylhexyl (meth)acrylate, nonyl(meth)acrylate, decyl(meth)acrylate, undecyl(meth)acrylate, dodecyl(meth)acrylate and the like. These may be used alone or in combinations of two or more.

The (A) binder polymer preferably contains a carboxyl group from the viewpoint of achieving more satisfactory alkali development as described hereunder. Such a binder polymer (A) may be obtained, for example, by radical polymerization of a carboxyl group-containing polymerizable monomer with another polymerizable monomer. (Meth) acrylic acid mentioned above is particularly preferred as a carboxyl group-containing polymerizable monomer.

The carboxyl group content of the (A) binder polymer (the proportion of polymerizable monomers with carboxyl groups with respect to the total polymerizable monomers used) is preferably 12-50 mass %, more preferably 12-40 mass %, even more preferably 15-30 mass % and most preferably 15-25 mass %, from the viewpoint of achieving a satisfactory balance between alkali development property and alkali resistance. A carboxyl group content of less than 12 mass % will tend to result in an inferior alkali development property, while a content of greater than 50 mass % will tend to lower the alkali resistance.

With alkali-developing photosensitive resin compositions, the unpolymerized photosensitive resin composition dissolves in the developing solution, and the dissolved components become a source of scum (oils) and sludge (solids) which adhere back onto the board and result in shorting defects. Scum or sludge is generated in particularly large amounts from photosensitive resin compositions containing monomers with urethane bonds, and the cohesiveness thereof increases its ability to adhere onto the board. For this reason, developing machines must be frequently cleaned to prevent shorting defects, while replacement of the filters used in circulating pumps must also be routinely carried out. With the photosensitive resin composition of the invention, however, it is possible to minimize generation of scum and sludge. From the viewpoint of more satisfactorily reducing generation of scum and sludge, the (A) binder polymer in the photosensitive resin composition of the invention preferably contains a compound represented by the following general formula (VIII) as a constituent component (monomer unit).

[Chemical Formula 8]

$$CH_2=C(L^1)\text{-}COOL^2 \qquad (VIII)$$

[In formula (VIII), $L^1$ represents hydrogen or methyl and $L^2$ represents a C4-20 alkyl group.]

As C4-20 alkyl groups represented by $L^2$ in general formula (VIII) there may be mentioned n-butyl, isobutyl, sec-butyl, tert-butyl, isopentyl, neopentyl and the like, as well as hexyl, heptyl, octyl, nonyl, decyl, undecyl, dodecyl, tridecyl, tetradecyl, pentadecyl, hexadecyl, heptadecyl, octadecyl, nonadecyl, eicosyl and their structural isomers. The aforementioned compounds wherein the alkyl groups are substituted with hydroxyl, epoxy or halogens may also be mentioned.

As examples of monomers represented by general formula (VIII) there may be mentioned butyl(meth)acrylate, pentyl (meth)acrylate, hexyl(meth)acrylate, heptyl(meth)acrylate, octyl(meth)acrylate, 2-ethylhexyl(meth)acrylate, nonyl (meth)acrylate, decyl(meth)acrylate, undecyl(meth)acrylate, dodecyl(meth)acrylate, tridecyl(meth)acrylate, tetradecyl (meth)acrylate, pentadecyl(meth)acrylate, hexadecyl(meth) acrylate, heptadecyl(meth)acrylate, octadecyl(meth)acrylate, nonadecyl(meth)acrylate, eicosyl(meth)acrylate and the like. These may be used alone or in combinations of two or more.

From the viewpoint of adhesion and release property, the (A) binder polymer preferably also contains styrene or a styrene derivative as a polymerizable monomer. Using styrene or a styrene derivative as a polymerizable monomer will result in good adhesion and a satisfactory release property of the photosensitive resin composition.

The content of the styrene or styrene derivative is preferably 0.1-30 mass %, more preferably 1-28 mass % and even more preferably 1.5-27 mass % based on the total mass of the polymerizable monomers in the binder polymer used as component (A). If the content is less than 0.1 mass % the adhesion of the photosensitive resin composition will tend to be reduced, while if it is greater than 30 mass % there will tend to be greater release fragmentation, necessitating a longer releasing time.

The weight-average molecular weight of the (A) binder polymer is not particularly restricted, but from the viewpoint of a satisfactory balance between mechanical strength and alkali development it is preferably 20,000-300,000, more preferably 30,000-150,000 and even more preferably 40,000-100,000. A weight-average molecular weight of less than 20,000 will tend to result in lower developing solution resistance, and greater than 300,000 will tend to lengthen the developing time. The weight-average molecular weight for the purpose of the invention is the value measured by gel permeation chromatography and calculated using a calibration curve prepared using standard polystyrene.

The (A) binder polymer used may be a single type or a combination of two or more types. As examples of binder polymers when two or more are used in combination, there may be mentioned two or more binder polymers composed of different copolymerizable components, two or more binder polymers with different weight-average molecular weights, and two or more binder polymers with different dispersibilities.

Component (B) will be explained next. Component (B) according to the invention is a photopolymerizing compound having at least one polymerizable ethylenic unsaturated group in the molecule, and it contains at least a photopolymerizing compound with an isocyanuric ring backbone represented by the following general formula (I).

[Chemical Formula 9]

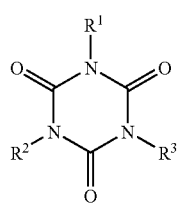

(I)

[In formula (I), $R^1$, $R^2$ and $R^3$ each independently represent a group represented by the following general formula (II):

[Chemical Formula 10]

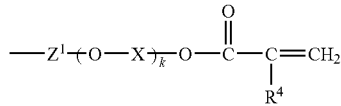

(II)

(in formula (II), $R^4$ represents hydrogen or methyl, X represents C2-6 alkylene, $Z^1$ represents a single bond or divalent organic group and k represents an integer of 1-30), or a group represented by the following general formula (III):

[Chemical Formula 11]

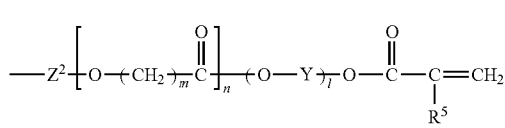

(III)

(in formula (III), $R^5$ represents hydrogen or methyl, $Z^2$ represents a single bond or divalent organic group, Y represents C2-6 alkylene, m represents an integer of 1-10, n represents an integer of 1-10 and l represents an integer of 0-10), and at least one from among $R^1$, $R^2$ and $R^3$ is a group represented by general formula (III).]

In general formulas (II) and (III), the C2-6 alkylene groups represented by X and Y may be, for example, ethylene, propylene, isopropylene, butylene, isobutylene, pentylene, neopentylene, hexylene or the like, among which ethylene and propylene are preferred. Isopropylene is a group represented by —CH(CH$_3$)CH$_2$—, so that the coupling directions for —(O—X)— and —(O—Y)— in general formulas (II) and (III) may be such that either the methylene is bonded to oxygen or the methylene is not bonded to oxygen, and when more than one —(O—X)— and —(O—Y)— are present the coupling directions of the isopropylene groups may be the same coupling direction or a combination of both coupling directions. When a plurality of —(O—X)— and —(O—Y)— repeating units are present, the two or more X and Y groups may be the same or different, and when X and Y are two different alkylene groups, the plurality of —(O—X)— and —(O—Y)— repeating units may be in either a random or block fashion.

For general formula (II) it was specified that k is an integer of 1-30, but from the viewpoint of hydrophilicity and developing solution resistance, it is preferably an integer of 3-20, more preferably an integer of 4-15 and most preferably an integer of 5-10.

Also, for general formula (III) it was specified that m is an integer of 1-10, but from the viewpoint of further improving the mechanical strength and flexibility of the obtained cured film, the lower limit for m is preferably 2 and more preferably 4, while the upper limit for m is preferably 8 and more preferably 6. It was also specified that n is an integer of 1-10, but from the viewpoint of further improving the mechanical strength and flexibility of the obtained cured film it is preferably an integer of 2-10, more preferably an integer of 3-8 and most preferably an integer of 4-6. In addition, it was also specified that l is an integer of 0-10, but from the viewpoint of further improving the mechanical strength and flexibility of the obtained cured film it is preferably an integer of 1-5 and more preferably an integer of 1-3.

From the viewpoint of still further improving the mechanical strength and flexibility of the cured film obtained using the photosensitive resin composition of the invention, X in general formula (II) is preferably ethylene or propylene and m in general formula (III) is preferably an integer of 4-10.

Also, preferably $Z^1$ in general formula (II) and/or $Z^2$ in general formula (III) are each independently a divalent group represented by the following general formula (IV), (V) or (VI).

[Chemical Formula 12]

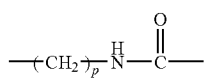

(IV)

[In formula (IV), p represents an integer of 1-10.]

[Chemical Formula 13]

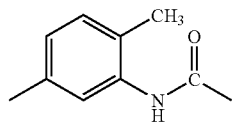

(V)

[Chemical Formula 14]

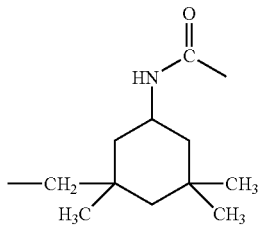

(VI)

Although it was specified that p in general formula (IV) is an integer of 1-10, from the viewpoint of further improving the mechanical strength and flexibility of the obtained cured film it is preferably an integer of 2-8 and more preferably an integer of 4-7.

From the viewpoint of further improving the flexibility of the obtained cured film, $Z^1$ and/or $Z^2$ are preferably groups represented by general formula (IV).

In general formula (I) there will be present a plurality of groups of either the group represented by general formula (II) and the group represented by general formula (III), and these multiple groups may be the same or different.

As an example of a production process for a compound represented by general formula (I) there may be mentioned a process in which a commercially available hexamethylene diisocyanate trimer (triisocyanate with an isocyanurate backbone) is reacted with a commercially available polycaprolactone-modified 2-hydroxyethyl(meth)acrylate and if necessary with a commercially available polyethyleneglycol (meth)acrylate, under conditions known in the prior art.

As examples of commercially available compounds represented by general formula (I) there may be mentioned a compound wherein $R^1$, $R^2$ and $R^3$ are groups represented by general formula (III), $R^5$ is methyl, Y is ethylene, m=5, n=3, l=1, $Z^2$ is a group represented by general formula (IV) and p=6 (product of Nihon Cytec Industries Inc.).

The compound represented by general formula (I) may be of a single type, or two or more thereof may be used in combination.

As examples of (B) photopolymerizing compounds other than compounds represented by general formula (I) there may be mentioned compounds obtained by reacting α,β-unsaturated carboxylic acids with polyhydric alcohols, compounds obtained by reacting α,β-unsaturated carboxylic acids with bisphenol A-based (meth)acrylate compounds such as 2,2-bis (4-((meth)acryloxypolyethoxy)phenyl)propane, 2,2-bis(4-((meth)acryloxypolypropoxy)phenyl)propane and 2,2-bis(4-((meth)acryloxypolyethoxypolypropoxy)phenyl)propane or glycidyl group-containing compounds, urethane monomers such as (meth)acrylate compounds with urethane bonds, and γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate, (meth)acrylic acid alkyl esters and the like, with bisphenol A-based (meth)acrylate compounds being preferred from the viewpoint of resolution and (meth)acrylate compounds with urethane bonds being preferred from the viewpoint of tent reliability. These may be used alone or in combinations of two or more.

As examples of the aforementioned 2,2-bis(4-((meth)acryloxypolyethoxy)phenyl)propanes there may be mentioned 2,2-bis(4-((meth)acryloxydiethoxy)phenyl)propane, 2,2-bis (4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytridecaethoxy)phenyl)propane, 2,2-bis(4-((meth)acryloxytetradecaethoxy)phenyl)propane, 2,2-bis(4-((meth)acryloxypentadecaethoxy)phenyl)propane and 2,2-bis(4-((meth)acryloxyhexadecaethoxy)phenyl)propane. Of these, 2,2-bis(4-(methacryloxypentaethoxy)phenyl)propane is commercially available as BPE-500 (product of Shin-Nakamura Chemical Co., Ltd.), and 2,2-bis(4-(methacryloxypentadecaethoxy)phenyl)propane is commercially available as BPE-1300 (product of Shin-Nakamura Chemical Co., Ltd.). These may be used alone or in combinations of two or more.

As examples of the aforementioned 2,2-bis(4-((meth)acryloxypolypropoxy)phenyl)propanes there may be mentioned 2,2-bis(4-((meth)acryloxydipropoxy)phenyl)propane, 2,2-bis(4-((meth)acryloxytripropoxy)phenyl)propane, 2,2-bis(4-((meth)acryloxytetrapropoxy)phenyl)propane, 2,2-bis(4-((meth)acryloxypentapropoxy)phenyl)propane, 2,2-bis(4-((meth)acryloxyhexapropoxy)phenyl)propane, 2,2-bis(4-((meth)acryloxyheptapropoxy)phenyl)propane, 2,2-bis(4-((meth)acryloxyoctapropoxy)phenyl)propane, 2,2-bis(4-((meth)acryloxynonapropoxy)phenyl)propane, 2,2-bis(4-((meth)acryloxydecapropoxy)phenyl)propane, 2,2-bis(4-((meth)acryloxyundecapropoxy)phenyl)propane, 2,2-bis(4-((meth)acryloxydodecapropoxy)phenyl)propane, 2,2-bis(4-((meth)acryloxytridecapropoxy)phenyl)propane, 2,2-bis(4-((meth)acryloxytetradecapropoxy)phenyl)propane, 2,2-bis (4-((meth)acryloxypentadecapropoxy)phenyl)propane and 2,2-bis(4-((meth)acryloxyhexadecapropoxy)phenyl)propane. These may also be used alone or in combinations of two or more.

As examples of the aforementioned 2,2-bis(4-((meth)acryloxypolyethoxypolypropoxy)phenyl)propanes there may be mentioned 2,2-bis(4-((meth)acryloxydiethoxyoctapropoxy) phenyl)propane, 2,2-bis(4-((meth)acryloxytetraethoxytetrapropoxy)phenyl)propane and 2,2-bis(4-((meth)acryloxyhexaethoxyhexapropoxy)phenyl)propane. These may also be used alone or in combinations of two or more.

As examples of compounds obtained by reacting α,β-unsaturated carboxylic acids with polyhydric alcohols there may be mentioned polyethyleneglycol di(meth)acrylates with 2-14 ethylene groups, polypropyleneglycol di(meth) acrylates with 2-14 propylene groups, polyethylenepolypropyleneglycol di(meth)acrylates with 2-14 ethylene groups and 2-14 propylene groups, trimethylolpropane di(meth) acrylates, trimethylolpropane tri(meth)acrylates, trimethylolpropane ethoxytri(meth)acrylates, trimethylolpropane diethoxytri(meth)acrylates, trimethylolpropane triethoxytri (meth)acrylates, trimethylolpropane tetraethoxytri(meth) acrylates, trimethylolpropane pentaethoxytri(meth)acrylates, tetramethylolmethane tri(meth)acrylates tetramethylolmethane tetra(meth)acrylates, polypropyleneglycol di(meth)acrylates with 2-14 propylene groups, dipentaerythritol penta(meth)acrylate, dipentaerythritol hexa(meth)acrylate and the like.

As examples of urethane monomers there may be mentioned addition reaction products of (meth)acrylic monomers having OH groups at the β position with diisocyanate compounds such as isophorone diisocyanate, 2,6-toluene diisocyanate, 2,4-toluene diisocyanate or 1,6-hexamethylene diisocyanate, as well as tris((meth)acryloxytetraethyleneglycol isocyanate)hexamethyleneisocyanurate, EO-modified urethane di(meth)acrylate, EO,PO-modified urethane di(meth)acrylate and the like. "EO" stands for ethylene oxide, and an EO-modified compound has a block structure of ethylene oxide groups. "PO" stands for propylene oxide, and a PO-modified compound has a block structure of propylene oxide groups. As an example of an EO-modified urethane di(meth)acrylate there may be mentioned UA-11 (product of Shin-Nakamura Chemical Co., Ltd.) and the like. As an example of an EO,PO-modified urethane di(meth)acrylate there may be mentioned UA-13 (product of Shin-Nakamura Chemical Co., Ltd.) and the like.

As examples of photopolymerization initiators for component (C) there may be mentioned aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butanone-1 and 2-methyl-1-[4-(methylthio)phenyl]-2-morpholino-propanone-1; quinones such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone and 2,3-dimethylanthraquinone; benzoinether compounds such as benzoinmethyl ether, benzoinethyl ether and benzoinphenyl ether; benzoin compounds such as benzoin, methylbenzoin and ethylbenzoin; benzyl derivatives such as benzyldimethylketal; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer; acridine derivatives such as 9-phenylacridine and 1,7-bis(9,9'-acridinyl)heptane; N-phenylglycine derivatives such as N-phenylglycine, coumarin-based compounds; oxazole-based compounds; and the like. In addition, substituents of the aryl groups of two 2,4,5-triaryl imidazoles may impart a symmetrical compound by being the same or may impart an asymmetrical compound by being different. A combination of a thioxanthone-based compound and tertiary amine compound may also be used, such as a combination of diethylthioxanthone and dimethylaminobenzoic acid. From the viewpoint of adhesion and sensitivity, a 2,4,5-triarylimidazole dimer is preferred. They may be used alone or in combinations of two or more.

The content of component (A) in the photosensitive resin composition of the invention is preferably 30-80 parts by mass and more preferably 45-70 parts by mass with respect to 100 parts by mass as the total of component (A) and component (B). If the content is less than 30 parts by mass the photocured composition may be too fragile, tending to result in inferior coatability when it is used to form a photosensitive element, while if it is greater than 80 parts by mass the photosensitivity will tend to be insufficient.

The content of component (B) in the photosensitive resin composition of the invention is preferably 20-70 parts by mass and more preferably 30-55 parts by mass with respect to 100 parts by mass as the total of component (A) and component (B). If the content is less than 20 parts by mass the photosensitivity will tend to be insufficient, and if it is greater than 60 parts by mass the photocured product will tend to be fragile and the coatability will tend to be insufficient when it is used to form a photosensitive element.

The proportion of compounds represented by general formula (I) among the total of component (B) is preferably 3-80 mass %, more preferably 5-60 mass % and most preferably 10-40 mass %, from the viewpoint of tent reliability and resolution.

The content of component (C) in the photosensitive resin composition of the invention is preferably 0.01-20 parts by mass and more preferably 0.2-5 parts by mass with respect to 100 parts by mass as the total of component (A) and component (B). If the content is less than 0.01 part by mass the photosensitivity will tend to be insufficient, and if it is greater than 20 parts by mass the absorption on the surface of the composition during exposure will increase, tending to result in insufficient interior photocuring.

The photosensitive resin composition may, if necessary, contain a dye such as malachite green, a photochromic agent such as tribromophenylsulfone or leuco crystal violet, a thermal development inhibitor, a plasticizer such as p-toluenesulfonamide, a pigment, filler, antifoaming agent, flame retardant, stabilizer, tackifier, leveling agent, release promoter, antioxidant, aromatic, imaging agent, thermal crosslinking agent or the like at about 0.01-20 parts by mass each with respect to 100 parts by mass as the total of component (A) and component (B). They may be used alone or in combinations of two or more.

The photosensitive resin composition may, if necessary, be used as a solution in a solvent such as methanol, ethanol, acetone, methyl ethyl ketone, methylcellosolve, ethylcellosolve, toluene, N,N-dimethylformamide or propyleneglycol monomethyl ether, or a mixture of such solvents, at a solid content of about 30-60 mass %.

The photosensitive resin composition of the invention is preferably coated as a liquid resist onto the surface of a metal such as copper, a copper-based alloy, nickel, chromium, iron or an iron-based alloy such as stainless steel, and preferably copper or a copper-based alloy or iron-based alloy, and then dried and subsequently covered with a protective film if necessary, or else used in the form of a photosensitive element as described below.

(Photosensitive Element)

FIG. 1 is a schematic view of the cross-sectional structure of a photosensitive element according to a preferred embodiment. As shown in FIG. 1, the photosensitive element 1 comprises a support 10, a photosensitive resin composition layer 20 formed on the support 10 and a protective film 30 formed on the photosensitive resin composition layer 20. The photosensitive resin composition layer 20 is a layer composed of a photosensitive resin composition of the invention as described above.

The support 10 of the photosensitive element 1 may be a polymer film having heat resistance and solvent resistance, such as polyethylene terephthalate, polypropylene, polyethylene or polyester, for example. If transparency is desired, it is preferred to use a polyethylene terephthalate film.

Since a support 10 composed of such polymer films must be subsequently removable from the photosensitive resin composition layer 20, they must not be of a material or be surface treated in a manner that would prevent their removal. The thickness of the polymer film is preferably 1-100 μm and more preferably 1-30 μm. If the thickness is less than 1 μm, the mechanical strength will tend to be reduced and problems such as tearing of the support 10 during coating may occur, while if it is greater than 30 μm, the resolution during exposure of the photosensitive resin composition layer 20 through the support 10 will tend to be lower, and the cost increased.

The protective film 30 may be the same type of polymer film as the support 10. The protective film 30 used is preferably selected so that the adhesive force between the photosensitive resin composition layer 20 and protective film 30 is lower than the adhesive force between the photosensitive resin composition layer 20 and support 10. The protective film 30 is also preferably a low fisheye film. The thickness of the protective film 30 is preferably 1-100 μm and more preferably 1-30 μm.

The photosensitive element 1 having such a construction may be fabricated by, for example, coating the support 10 with a coating solution obtained by dissolving the photosensitive resin composition in a prescribed solvent, and then removing the solvent to form a photosensitive resin composition layer 20 and subsequently laminating a protective film 30 on the photosensitive resin composition layer 20. The coating solution is preferably a solution of the photosensitive resin composition as described above.

The coating may be accomplished by a publicly known method using, for example, a roll coater, comma coater, gravure coater, air knife coater, die coater, bar coater, spray coater or the like. The solvent removal can be carried out at 70-150° C. for about 5-30 minutes.

The amount of residual organic solvent in the photosensitive resin composition layer 20 is preferably no greater than 2 mass % from the viewpoint of preventing diffusion of the organic solvent in subsequent steps.

The thickness of the photosensitive resin composition layer 20 will differ depending on the use, but the post-drying thickness is preferably 1-200 μm and more preferably 1-100 μm. A thickness of less than 1 μm will tend to hamper industrial coating, while a thickness of greater than 200 μm will lower the effect of the invention and tend to result in insufficient sensitivity, thus impairing the photocuring property at the base of the resist.

The photosensitive element 1 may comprise, in addition to the photosensitive resin composition layer 20, support 10 and protective film 30, also interlayers or protective layers such as a cushion layer, adhesive layer, photoabsorbing layer, gas barrier layer and the like.

The photosensitive element 1 may be stored as is in the form of a flat sheet, or as a roll wound up on a winding core with a cylindrical or other shape. In the latter case, it is preferably wound with the support 10 on the outermost side. An edge separator is preferably situated at the edge of the photosensitive element roll from the viewpoint of edge protection, while from the viewpoint of preventing edge fusion, the edge separator is preferably moisture-proof. The packaging method is preferably one that involves bundling in a black sheet with low moisture permeability.

The photosensitive element 1 does not necessarily require the protective film 30, and it may have a two-layer structure with the support 10 and photosensitive resin composition layer 20.

(Resist Pattern Forming Method)

The resist pattern forming method of the invention is a method in which the photosensitive resin composition layer 20 of a photosensitive element 1 of the invention as described above is laminated on a circuit-forming board and prescribed sections of the photosensitive resin composition layer 20 are exposed to active light rays to form exposed sections, after which the sections other than the exposed sections are removed.

The method of laminating the photosensitive resin composition layer 20 on the circuit-forming board may be one in which, if the photosensitive element has a protective film, the protective film is removed and the photosensitive resin composition layer 20 is contact bonded with the circuit-forming board at a pressure of about 0.1-1 MPa (1-10 kgf/cm$^2$) while heating at about 70-130° C. The lamination step is preferably carried out under reduced pressure from the viewpoint of adhesion and follow-up property. The surface of the board on which the photosensitive resin composition layer 20 is to be laminated is not particularly restricted, although it will usually be a metal surface. If the photosensitive resin composition layer 20 is heated at 70-130° C. as mentioned above it is not necessary to subject the circuit-forming board to preheating beforehand, but the circuit-forming board may still be preheated for further enhanced laminating properties.

The photosensitive resin composition layer 20 laminated on the board in the manner described above is irradiated with active light rays through a negative or positive mask pattern in the form of an image to form exposed sections. If the support 10 on the photosensitive resin composition layer 20 is transparent to the active light rays it is possible to irradiate the active light rays through the support 10, but if the support 10 is opaque to the active light rays the photosensitive resin composition layer 20 must be irradiated with the active light rays after removing the support 10.

The light source for the active light rays may be a light source known in the prior art, such as a carbon arc lamp, mercury vapor arc lamp, ultra-high-pressure mercury lamp, high-pressure mercury lamp, xenon lamp or the like, which efficiently emits ultraviolet rays. There may also be used a lamp that efficiently emits visible light rays, such as a photoflood lamp or sun lamp. Laser direct writing exposure methods may also be employed.

After forming the exposed sections, the sections of the photosensitive resin composition layer other than the exposed sections (the unexposed sections) are removed by development to form a resist pattern. The method of removing the unexposed sections may be a method in which the support 10 is first removed when the support 10 is present on the photosensitive resin composition layer 20, and then the unexposed sections are removed by development such as wet development, dry development or the like. In the case of wet development, a developing solution suitable for photosensitive resin compositions may be used, such as an aqueous alkali solution, aqueous developing solution or organic solvent, and development may be accomplished by a publicly known method such as spraying, reciprocal dipping, brushing, scrapping or the like. The developing solution used is preferably one which is safe and stable and easily manageable, such as an aqueous alkali solution.

As bases for the aqueous alkali solution there may be used, for example, alkali hydroxides such as hydroxides of lithium, sodium, potassium and the like, alkali carbonates such as carbonates or bicarbonates of lithium, sodium, potassium, ammonium and the like, alkali metal phosphates such as potassium phosphate and sodium phosphate, and alkali metal pyrophosphates such as sodium pyrophosphate and potassium pyrophosphate. The aqueous alkali solution used for development is preferably a 0.1-5 mass % sodium carbonate dilute solution, a 0.1-5 mass % potassium carbonate dilute solution, a 0.1-5 mass % sodium hydroxide dilute solution or a 0.1-5 mass % sodium tetraborate dilute solution. The pH of the aqueous alkali solution used for development is preferably in the range of 9-11, and the temperature is adjusted as appropriate for the developing property of the photosensitive resin composition layer 20. The aqueous alkali solution may also contain added surfactants, defoaming agents, and small amounts of organic solvent to accelerate development.

An aqueous developing solution used may be composed of water or an aqueous alkali solution and one or more organic solvents. As examples of bases for the aqueous alkali solution there may be mentioned, in addition to the substances mentioned above, also borax or sodium metasilicate, tetramethylammonium hydroxide, ethanolamine, ethylenediamine, diethylenetriamine, 2-amino-2-hydroxymethyl-1,3-propanediol, 1,3-diaminopropanol-2, morpholine and the like.

The pH of the developing solution is preferably in as low a range that still allows sufficient development of the resist, and is preferably pH 8-12 and more preferably pH 9-10.

As examples of organic solvents there may be mentioned triacetone alcohol, acetone, ethyl acetate, alkoxyethanols with C1-4 alkoxy groups, ethyl alcohol, isopropyl alcohol, butyl alcohol, diethyleneglycol monomethyl ether, diethyleneglycol monoethyl ether, diethyleneglycol monobutyl ether and the like. They may be used alone or in combinations of two or more. The concentration of the organic solvent is normally preferred to be 2-90 mass %, and the temperature may be adjusted as appropriate for the developing property. The aqueous developing solution may also contain small amounts of added surfactants, defoaming agents and the like. As examples of organic solvent-based developing solutions to be used alone there may be mentioned 1,1,1-trichloroethane, N-methylpyrrolidone, N,N-dimethylformamide, cyclohexanone, methyl isobutyl ketone, γ-butyrolactone and the like. Water is preferably added to these organic solvents in a range of 1-20 mass % for anti-flammability. Two or more different developing methods may also be carried out in combination if necessary.

The developing system may be a dip system, paddle system, spray system, brushing, slapping or the like, but a high-pressure spray system is most suitable for improved resolution.

Post-development treatment may consist of heating at about 60-250° C. or exposure at about 0.2-10 mJ/cm$^2$ if necessary for further curing of the resist pattern. A cupric chloride solution, ferric chloride solution, alkali etching solution or the like may be used for etching of the metal surface after development.

(Printed Circuit Board Production Process)

The printed circuit board production process of the invention is a process characterized in that a circuit-forming board having a resist pattern formed by the resist pattern forming method of the invention is etched or plated.

The etching or plating of the circuit-forming board is carried out on the conductive layer of the circuit-forming board using the formed resist pattern as a mask. The etching solution used for etching may be a cupric chloride solution, ferric chloride solution, alkali etching solution, hydrogen peroxide etching solution or the like, with a ferric chloride solution being preferred for a more satisfactory etch factor. As examples of plating methods for the plating there may be mentioned copper plating such as copper sulfate plating and copper pyrophosphate plating, solder plating such as high throwing solder plating, nickel plating such as Watt bath (nickel sulfate-nickel chloride) plating or nickel sulfaminate plating, and gold plating such as hard gold plating or soft gold plating.

After completion of the etching or plating, the resist pattern is released with, for example, an aqueous solution of stronger alkalinity than the aqueous alkali solution used for development. The strongly alkaline aqueous solution used here may be, for example, a 1-10 mass % sodium hydroxide aqueous solution or a 1-10 mass % potassium hydroxide aqueous solution. The releasing system may be, for example, a dipping system, spraying system or the like, and a dipping or spraying system may be used either alone or in combination. The printed circuit board on which the resist pattern has been formed may be a multilayer printed circuit board, and it may also have small through-holes.

EXAMPLES

The present invention will now be explained in greater detail based on examples and comparative examples, with the understanding that the invention is in no way limited to the examples.

[Preparation of Component (A) 1]

In a flask equipped with a stirrer, reflux condenser, thermometer, dropping funnel and nitrogen gas inlet tube there was added 400 g of a mixture of methylcellosolve and toluene (methylcellosolve/toluene=3/2 (mass ratio), hereinafter referred to as "solution S1"), and the mixture was stirred while blowing in nitrogen gas and heated to 80° C. As monomer there was prepared a mixture of 125 g of methacrylic acid, 250 g of methyl methacrylate, 100 g of butyl acrylate, 25 g of styrene and 0.8 g of azobisisobutyronitrile (hereinafter referred to as "solution S2"), and solution S2 was added dropwise to the 80° C.-heated solution S1 over a period of 4 hours, after which the mixture was kept for 2 hours at 80° C. while stirring. Also, a solution of 1.2 g of azobisisobutyronitrile in 100 g of solution S1 was added dropwise to the flask over a period of 10 minutes. After keeping the solution in the flask at 80° C. for 3 hours while stirring, it was heated to 90° C. over a period of 30 minutes. It was then kept at 90° C. for 2 hours and subsequently cooled to obtain a binder polymer solution as component (A)1. Acetone was added to the binder polymer solution, and the non-volatilizing components (solid portion) were adjusted to 50 mass %. The weight-average molecular weight of the obtained binder polymer was 80,000. The weight-average molecular weight was measured by gel permeation chromatography, and calculation was performed using a standard polystyrene calibration curve. The GPC conditions were as follows.

(GPC Conditions)

Pump: Hitachi L-6000 (Hitachi, Ltd.)

Column: Gelpack GL-R420+Gelpack GL-R430+Gelpack GL-R440 (total: 3) (all trade names of Hitachi Chemical Co., Ltd.)

Eluent: tetrahydrofuran

Measuring temperature: 25° C.

Flow rate: 2.05 mL/min

Detector: Hitachi L-3300 RI (Hitachi, Ltd.)

[Preparation of Component (A)2]

A binder polymer solution (non-volatilizing components (solid portion): 50 mass %) was prepared as component (A)2 in the same manner as preparation of component (A)1, except that 100 g of methacrylic acid, 275 g of methyl methacrylate and 125 g of ethyl acrylate were used as monomer. The weight-average molecular weight of the obtained binder polymer was 80,000.

[Preparation of Component (A)3]

A binder polymer solution (non-volatilizing components (solid portion): 50 mass %) was prepared as component (A)3 in the same manner as preparation of component (A)1, except that 100 g of methacrylic acid, 250 g of methyl methacrylate, 100 g of butyl acrylate and 50 g of styrene were used as monomer. The weight-average molecular weight of the obtained binder polymer was 80,000.

[Preparation of Component (A)4]

A binder polymer solution (non-volatilizing components (solid portion): 50 mass %) was prepared as component (A)4 in the same manner as preparation of component (A)1, except that 100 g of methacrylic acid, 250 g of methyl methacrylate, 100 g of ethyl acrylate and 50 g of 2-ethylhexyl acrylate were used as monomer. The weight-average molecular weight of the obtained binder polymer was 80,000.

[Preparation of Component (A)5]

A binder polymer solution (non-volatilizing components (solid portion): 50 mass %) was prepared as component (A)5 in the same manner as preparation of component (A)1, except that 100 g of methacrylic acid, 250 g of methyl methacrylate, 100 g of ethyl acrylate and 50 g of styrene were used as monomer. The weight-average molecular weight of the obtained binder polymer was 80,000.

The compositions of components (A)1-(A)5 are shown in Table 1.

TABLE 1

| | |
|---|---|
| Component (A)1 | 50 mass % Solution of methacrylic acid/methyl methacrylate/butyl acrylate/styrene (25/50/20/5 (mass ratio)) copolymer (wt.-average mol. wt. = 80,000) in methyl cellosolve/toluene (6/4 (mass ratio)) |
| Component (A)2 | 50 mass % Solution of methacrylic acid/methyl methacrylate/ethyl acrylate (20/55/25 (mass ratio)) copolymer (wt.-average mol. wt. = 80,000) in methyl cellosolve/toluene (6/4 (mass ratio)) |
| Component (A)3 | 50 mass % Solution of methacrylic acid/methyl methacrylate/butyl acrylate/styrene (20/50/20/10 (mass ratio)) copolymer (wt.-average mol. wt. = 80,000) in methyl cellosolve/toluene (6/4 (mass ratio)) |
| Component (A)4 | 50 mass % Solution of methacrylic acid/methyl methacrylate/ethyl acrylate/2-ethylhexyl acrylate (20/50/20/10 (mass ratio)) copolymer (wt.-average mol. wt. = 80,000) in methyl cellosolve/toluene (6/4 (mass ratio)) |
| Component (A)5 | 50 mass % Solution of methacrylic acid/methyl methacrylate/ethyl acrylate/styrene (20/50/20/10 (mass ratio)) copolymer (wt.-average mol. wt. = 80,000) in methyl cellosolve/toluene (6/4 (mass ratio)) |

Examples 1-12 and Comparative Examples 1-3

The materials shown in Tables 2 to 4 were combined in the amounts listed in the tables (units: parts by mass) to obtain photosensitive resin composition solutions for Examples 1-12 and Comparative Examples 1-3.

TABLE 2

| | Material | Content (parts by mass) |
|---|---|---|
| Component (C) | 2-(o-Chlorophenyl)-4,5-diphenylimidazole dimer | 5 |
| Additives | N,N'-tetraethyl-4,4'-diaminobenzophenone | 0.2 |
| | Malachite green | 0.05 |
| | Leuco crystal violet | 0.5 |
| Solvent | Acetone | 15 |
| | Toluene | 10 |
| | Methanol | 10 |

TABLE 3

| | | Example 1 | Example 2 | Example 3 | Example 4 | Example 5 | Example 6 | Example 7 | Example 8 | Comp. Ex. 1 |
|---|---|---|---|---|---|---|---|---|---|---|
| Component (A) | Component (A)1 | 100 (Solid: 50) | 100 (Solid: 50) | 100 (Solid: 50) | 100 (Solid: 50) | 100 (Solid: 50) | 100 (Solid: 50) | 100 (Solid: 50) | — | 100 (Solid: 50) |
| | Component (A)2 | — | — | — | — | — | — | — | 100 (Solid: 50) | — |
| Component (B) | BPE-500[*1] | 30 | 30 | 30 | 30 | 30 | 30 | 30 | 30 | 30 |
| | FA-MECH[*2] | 10 | 5 | 5 | 5 | 5 | 5 | 5 | 5 | 5 |
| | Sample A[*3] | 10 | — | — | — | — | — | — | — | — |
| | Sample B[*4] | — | 15 | — | — | — | — | — | — | — |
| | Sample C[*5] | — | — | 15 | — | — | — | — | — | — |
| | Sample D[*6] | — | — | — | 15 | — | — | — | — | — |
| | Sample E[*7] | — | — | — | — | 15 | — | — | — | — |
| | Sample F[*8] | — | — | — | — | — | 15 | — | — | — |
| | Sample G[*9] | — | — | — | — | — | — | 15 | 15 | — |
| | UA-21[*10] | — | — | — | — | — | — | — | — | 15 |

TABLE 4

| | | Example 9 | Example 10 | Example 11 | Example 12 | Comp. Ex. 2 | Comp. Ex. 3 |
|---|---|---|---|---|---|---|---|
| Component (A) | Component (A)3 | 100 (Solid: 50) | 100 (Solid: 50) | — | — | — | — |
| | Component (A)4 | — | — | 100 (Solid: 50) | 100 (Solid: 50) | — | — |
| | Component (A)5 | — | — | — | — | 100 (Solid: 50) | 100 (Solid: 50) |
| Component (B) | BPE-500[*1] | 30 | 30 | 30 | 30 | 30 | 35 |
| | FA-MECH[*2] | 10 | 10 | 10 | 10 | 10 | 15 |
| | Sample A[*3] | 10 | — | 10 | — | — | — |
| | Sample F[*8] | — | 10 | — | 10 | — | — |
| | UA-21[*10] | — | — | — | — | 10 | — |

The materials listed in Tables 3 and 4 are the following.

[*1](BPE-500 ™): 2,2-Bis(4-(methacryloxypentadecaethoxy)phenyl (product of Shin-Nakamura Chemical Co., Ltd.)
[*2](FA-MECH ™): γ-Chloro-β-hydroxypropyl-β'-methacryloyloxyethyl-o-phthalate (Hitachi Chemical Co., Ltd.)
[*3](Sample A): A compound represented by general formula (I) above wherein $R^1$, $R^2$ and $R^3$ are groups represented by general formula (III), $R^5$ is methyl, Y is ethylene, m = 5, n = 3, l = 1, $Z^2$ is a group represented by general formula (IV) and p = 6 (product of Nihon Cytec Industries Inc., Sample Name: JTX0100).
[*4](Sample B): A compound represented by general formula (I) above wherein $R^1$ is a group represented by general formula (II), $R^2$ and $R^3$ are groups represented by general formula (III), $R^4$ is methyl, X is ethylene, k = 7, $R^5$ is methyl, Y is ethylene, m = 5, n = 3, l = 1, $Z^1$ and $Z^2$ are groups represented by general formula (IV) and p = 6 (product of Nihon Cytec Industries Inc., Sample Name: JTX0101).
[*5](Sample C): A compound represented by general formula (I) above wherein $R^1$ is a group represented by general formula (II), $R^2$ and $R^3$ are groups represented by general formula (III), $R^4$ is methyl, X is propylene, k = 14, $R^5$ is methyl, Y is ethylene, m = 5, n = 3, l = 1, $Z^1$ and $Z^2$ are groups represented by general formula (IV) and p = 6 (product of Nihon Cytec Industries Inc., Sample Name: JTX0228).
[*6](Sample D): A compound represented by general formula (I) above wherein $R^1$ and $R^2$ are groups represented by general formula (II), $R^3$ is a group represented by general formula (III), $R^4$ is methyl, X is ethylene, k = 7, $R^5$ is methyl, Y is ethylene, m = 5, n = 3, l = 1, $Z^1$ and $Z^2$ are groups represented by general formula (IV) and p = 6 (product of Nihon Cytec Industries Inc., Sample Name: JTX0307).
[*7](Sample E): A compound represented by general formula (I) above wherein $R^1$ and $R^2$ are groups represented by general formula (II), $R^3$ is a group represented by general formula (III), $R^4$ is methyl, X is ethylene, k = 7, $R^5$ is methyl, Y is ethylene, m = 5, n = 2, l = 1, $Z^1$ and $Z^2$ are groups represented by general formula (IV) and p = 6 (product of Nihon Cytec Industries Inc., Sample Name: JTX0306).
[*8](Sample F): A compound represented by general formula (I) above wherein $R^1$ and $R^2$ are groups represented by general formula (II), $R^3$ is a group represented by general formula (III), $R^4$ is methyl, X is ethylene, k = 7, $R^5$ is methyl, Y is ethylene, m = 5, n = 4, l = 1, $Z^1$ and $Z^2$ are groups represented by general formula (IV) and p = 6 (product of Nihon Cytec Industries Inc., Sample Name: JTX0309).
[*9](Sample G): A compound represented by general formula (I) above wherein $R^1$ and $R^2$ are groups represented by general formula (II), $R^3$ is a group represented by general formula (III), $R^4$ is hydrogen, X is ethylene, k = 7, $R^5$ is methyl, Y is ethylene, m = 5, n = 4, l = 1, $Z^1$ and $Z^2$ are groups represented by general formula (IV) and p = 6 (product of Nihon Cytec Industries Inc., Sample Name: JTX0274).
[*10](UA-21 ™): Tris(methacryloyloxytetraethyleneglycolisocyanatohexamethylene)isocyanurate (product of Shin-Nakamura Chemical Co., Ltd.).

The solution of each obtained photosensitive resin composition was then evenly coated onto a 16 μm thick polyethylene terephthalate film (PET film, G2-16™ by Teijin, Ltd.) as the support and dried for 10 minutes with a hot air convection drier at 100° C. to form a photosensitive resin composition layer, after which the photosensitive resin composition layer was covered with a polyethylene protective film (NF-13™, product of Tamapoly Co., Ltd.) to obtain photosensitive elements for Examples 1-12 and Comparative Examples 1-3. The dried film thickness of the photosensitive resin composition layer was 40 μm.

[Evaluation of Tent Reliability]

Figure 2:
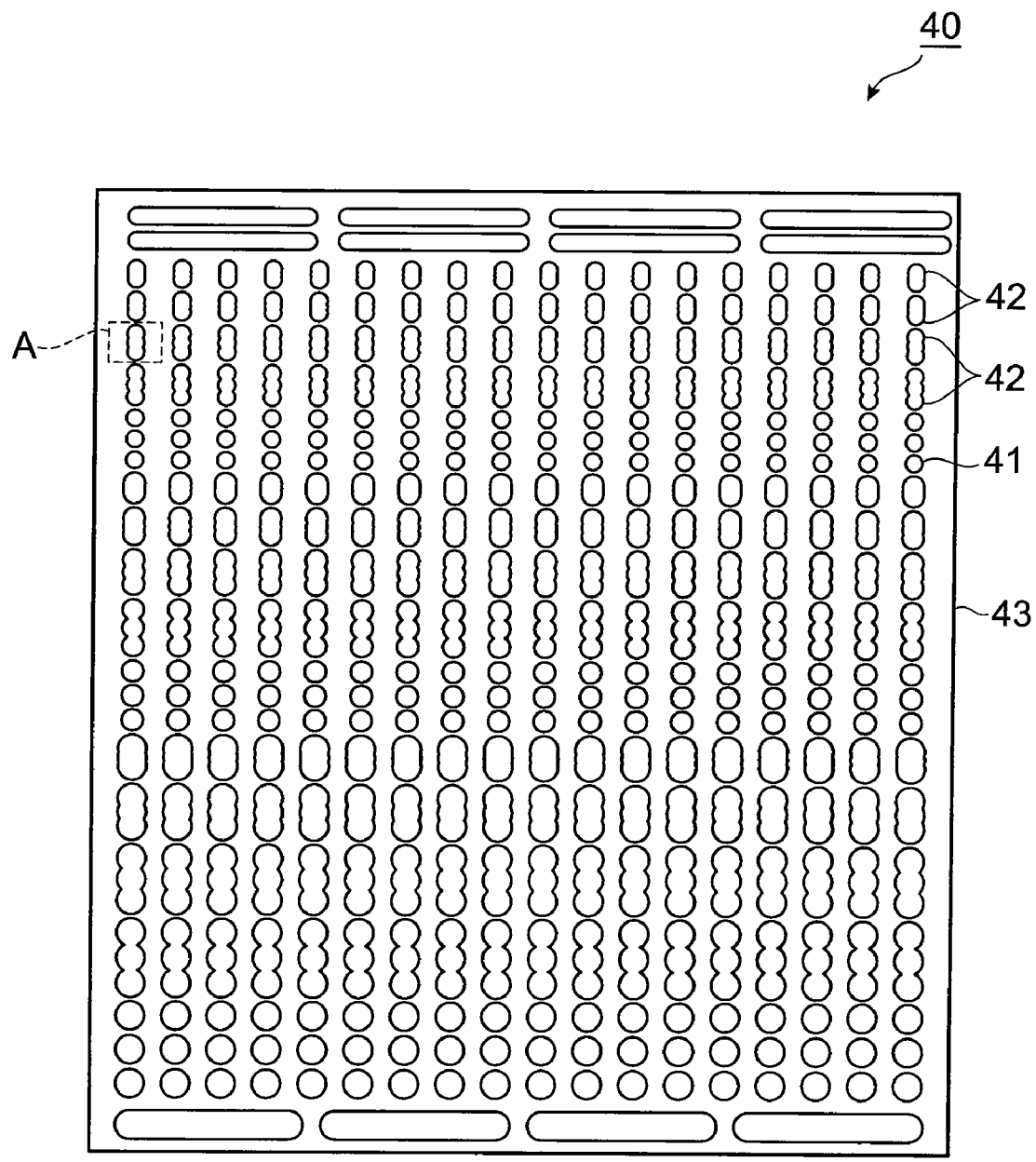
FIG. 2 is a plan view of a hole tear counting board used for evaluation of the irregular tent tear rate for the examples.
Figure 3:
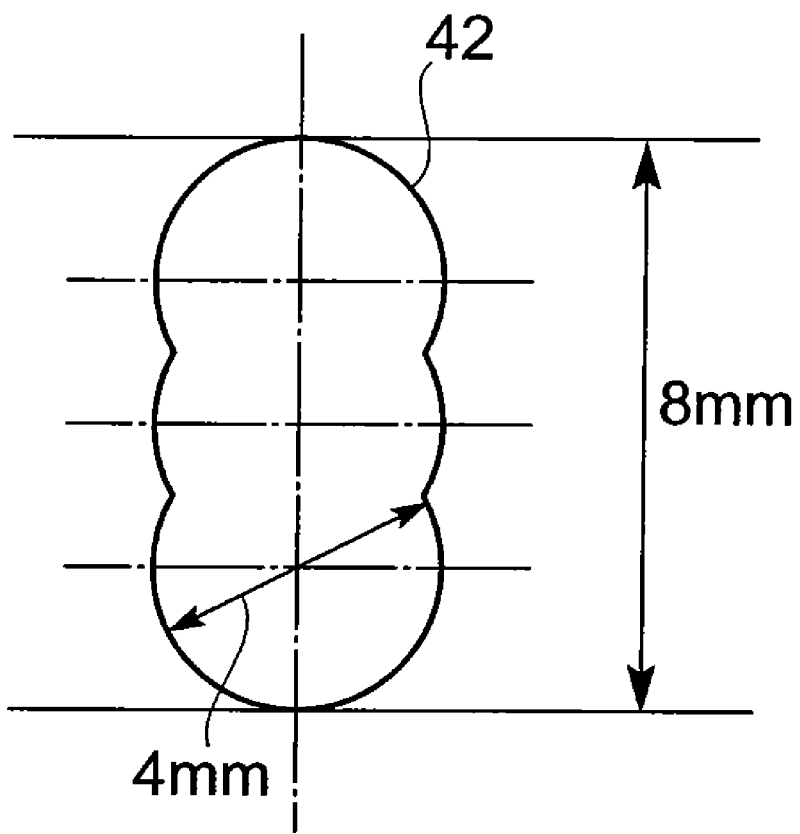
FIG. 3 is a magnified view of three continuous holes in region A of FIG. 2.

As shown in FIG. 2, a 1.6 mm-thick copper clad laminate 43 (MCL-E67™, product of Hitachi Chemical Co., Ltd.) having 35 μm-thick copper foils attached on both sides was cut with a die cutter into a round holes 41 and strings of three continuous holes 42, the hole diameters being 4 mm, 5 mm and 6 mm. The board was subjected to electroless plating for 15 minutes at 30° C. with a Noviganth HC bath by Atotech Japan, followed by plating for 40 minutes at 25° C., 2.0 A/dm$^2$ with a Kapalacid HL bath by Atotech Japan. The burrs produced by forming the round holes 41 and the three continuous holes 42 were removed using a polisher (Sankei Co., Ltd.) with a #600 equivalent brush, for use as the hole tear counting board 40. FIG. 3 is a magnified view of three continuous holes 42 in region A of FIG. 2.

The obtained hole tear counting board 40 was heated to 80° C., and the photosensitive elements obtained in Examples 1-12 and Comparative Examples 1-3 were each placed on the copper surface and laminated under conditions of 120° C., 0.4 MPa while releasing the protective film, with the photosensitive resin composition layer on the hole tear counting board 40 side. After lamination the hole tear counting board 40 was cooled, and upon reaching a temperature of 23° C., a 41-step tablet (Hitachi 41-step tablet, trade name of Fuji Film Co.) was bonded to the PET film surface and an exposure apparatus equipped with a high-pressure mercury lamp (HAW-201B, trade name of Orc Manufacturing Co., Ltd.) was used for photocuring of the photosensitive resin composition layer with an exposure dose for photocuring of 23 steps.

Following exposure, the board was allowed to stand at room temperature for 15 minutes, and then the PET film support was released and developed by spraying a 1 mass % aqueous sodium carbonate at 30° C. for 60 seconds. After development, the numbers of hole tears in the cured film (resist) that formed on the three continuous holes 42 were counted, and the irregular tent tear rate was calculated. A lower irregular tent tear rate may be considered to be more satisfactory tent reliability.

The cured film formed on the round holes 41 with hole diameters of 4 mm was pressed using a cylinder with an insertion diameter of 1.5 mm, and the strength and elongation until breakage were measured using a rheometer (by Rheotech Co., Ltd.). Larger numerical values for the strength and elongation measured in this manner may be considered to be more satisfactory tent reliability. The results are shown in Tables 6 and 7.

[Evaluation of Sensitivity, Resolution and Adhesion]
<Sensitivity>

For examination of the sensitivity, the photosensitive resin composition layers of each of the photosensitive elements obtained in the manner described above were laminated on copper-clad laminates. A phototool with a 41-step tablet was then bonded to the photosensitive resin composition layer and exposed to light with an exposure dose of 50 mJ/cm$^2$. The sensitivity was evaluated based on the number of steps remaining after development. The results are shown in Tables 6 and 7. A greater number of remaining step tablet steps (a larger numerical value) represents higher sensitivity.

<Resolution>

First, the photosensitive resin composition layer of the photosensitive element was laminated on a copper-clad laminate in the same manner as for evaluation of the sensitivity. Next, a phototool with a 41-step tablet and a phototool having a wiring pattern with a line width/space width of 30/30-200/200 (units: μm) as a negative for evaluation of resolution were bonded to the photosensitive resin composition layer, and exposure was carried out with an energy dose for 23 remaining steps after development of the 41-step tablet. The smallest value for the space width between line widths that allowed clean removal of the unexposed sections by developing treatment was recorded as the resolution. The results are shown in Tables 6 and 7. For this evaluation, a smaller numerical value represents more satisfactory resolution.

<Adhesion>

First, the photosensitive resin composition layer of the photosensitive element was laminated on a copper-clad laminate in the same manner as for evaluation of the resolution. Next, a phototool with a 41-step tablet and a phototool having a wiring pattern with a line width/space width of 6/30-47/200 (units: μm) as a negative for evaluation of adhesion were bonded to the photosensitive resin composition layer, and exposure was carried out with an energy dose for 23 remaining steps after development of the 41-step tablet. The adhesion was evaluated based on the smallest value of the line width that permitted bonding without peeling after development. The results are shown in Tables 6 and 7. For this evaluation, a smaller minimum line width value represents more satisfactory adhesion.

[Evaluation of Scum and Sludge]

The photosensitive element photosensitive resin composition layer was dissolved in 1.0 mass % aqueous sodium carbonate to 0.25 m$^2$ of photosensitive resin composition layer per 1 L of aqueous sodium carbonate. The solution was then bubbled with air at 1 L/min, 30° C. for 3 hours. During the procedure, the scum generated in the solution (scum dispersibility) was visually examined against the criteria shown in Table 5. The sludge produced in the solution was separated with a centrifugal separator, filtered and dried at 150° C. for 4 hours, and the mass of the sludge was measured. The results are shown in Tables 6 and 7.

TABLE 5

| Evaluation | Criteria |
|---|---|
| A | No scum observed |
| B | Slight scum observed |
| C | Moderate scum observed |
| D | Significant scum observed |

TABLE 6

|  | Example 1 | Example 2 | Example 3 | Example 4 | Example 5 | Example 6 | Example 7 | Example 8 | Comp. Ex. 1 |
|---|---|---|---|---|---|---|---|---|---|
| Irregular tent tear rate (%) | 13 | 12 | 12 | 10 | 12 | 8 | 9 | 9 | 39 |
| Strength (N) | 5.0 | 5.2 | 5.2 | 5.5 | 5.5 | 5.8 | 5.8 | 5.6 | 4.2 |
| Elongation (mm) | 1.2 | 1.3 | 1.3 | 1.4 | 1.3 | 1.3 | 1.3 | 1.5 | 0.9 |
| Sensitivity (step) | 23.2 | 23.2 | 23.4 | 23.1 | 23.0 | 22.8 | 22.9 | 23.0 | 23.3 |

TABLE 6-continued

|  | Example 1 | Example 2 | Example 3 | Example 4 | Example 5 | Example 6 | Example 7 | Example 8 | Comp. Ex. 1 |
| --- | --- | --- | --- | --- | --- | --- | --- | --- | --- |
| Resolution (μm) | 45 | 45 | 50 | 45 | 45 | 50 | 50 | 45 | 50 |
| Adhesion (μm) | 18 | 18 | 18 | 18 | 18 | 18 | 18 | 20 | 18 |
| Scum dispersibility | A | A | A | A | A | A | A | C | A |
| Sludge (g/L) | 1.1 | 1.3 | 1.2 | 1.1 | 1.0 | 1.1 | 1.1 | 1.2 | 1.0 |

TABLE 7

|  | Example 9 | Example 10 | Example 11 | Example 12 | Comp. Ex. 2 | Comp. Ex. 3 |
| --- | --- | --- | --- | --- | --- | --- |
| Irregular tent tear rate (%) | 15 | 13 | 10 | 10 | 45 | 64 |
| Strength (N) | 5.4 | 5.6 | 5.4 | 5.7 | 4.2 | 3.9 |
| Elongation (mm) | 1.3 | 1.4 | 1.5 | 1.5 | 0.9 | 1.1 |
| Sensitivity (step) | 22.9 | 23.0 | 23.0 | 23.1 | 23.3 | 23.0 |
| Resolution (μm) | 40 | 40 | 45 | 45 | 40 | 40 |
| Adhesion (μm) | 15 | 15 | 20 | 20 | 15 | 15 |
| Scum dispersibility | A | A | A | A | D | D |
| Sludge (g/L) | 1.0 | 1.1 | 1.1 | 1.2 | 2.0 | 1.9 |

As seen by the results in Tables 6 and 7, the photosensitive resin compositions of the invention (Examples 1-12) were demonstrated to have lower irregular tent tear rates and greater strength and elongation values than the photosensitive resin compositions of Comparative Examples 1-3. This confirmed that photosensitive resin compositions according to the invention can form cured films with sufficient mechanical strength and flexibility, as well as excellent tent reliability. It was demonstrated, as well that the invention can provide photosensitive elements that employ the photosensitive resin compositions, a resist pattern forming method and a printed circuit board production process.

INDUSTRIAL APPLICABILITY

As explained above, the invention can provide a photosensitive resin composition with excellent tent reliability that allows formation of cured films with sufficient mechanical strength and flexibility, as well as a photosensitive element employing the same, resist pattern forming method and printed circuit board production process.

The invention claimed is:

1. A resist pattern forming method comprising the steps of:
(a) providing photosensitive element, comprising a support, and a photosensitive resin composition layer comprising a photosensitive resin composition formed on the support, wherein the photosensitive resin composition comprises
(1) a binder polymer;
(2) a photopolymerizing compound with at least one polymerizable ethylenic unsaturated group in the molecule; and
(3) a photopolymerization initiator, wherein component (B) contains a compound represented by the following general formula (I),

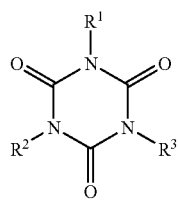

(I)

wherein in formula (I) $R^1$, $R^2$ and $R^3$ each independently represent a group represented by the following general formula (II),

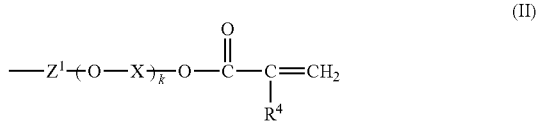

(II)

wherein in formula (II) $R^4$ represents hydrogen or methyl, X represents C2-6 alkylene, and k represents an integer of 1-30, or
wherein in formula (I) $R^1$, $R^2$ and $R^3$ each independently represent a group represented by the following general formula (III),

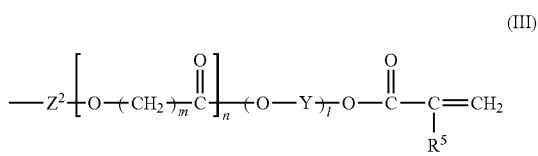

(III)

wherein in formula (III) $R^5$ represents hydrogen or methyl, Y represents C2-6 alkylene, m represents an integer of 1-10, n represents an integer of 1-10, and l represents an integer 1,
wherein at least one from $R^1$, $R^2$ and $R^3$ is a group represented by general formula (III),
wherein $Z^1$ in formula (II) and $Z^2$ in formula (II) each independently represent a divalent group represented by the following general formulas (IV), (V) or (VI) provided below as

(IV)

wherein in formula (IV) p represents an integer of 1-10,

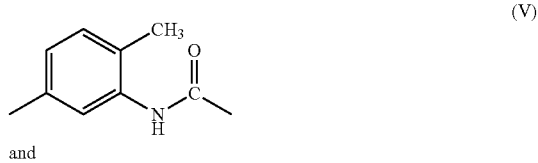

(V)

and

-continued (VI)

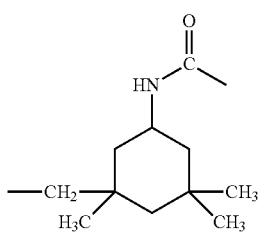

(b) laminating the photosensitive resin composition layer of the photosensitive element on a circuit-forming board, and
(c) exposing prescribed sections of the photosensitive resin composition layer to active light rays to form exposed sections, after which sections other than the exposed sections are removed.

2. A process for production of a printed circuit hoard comprising the steps of:
(i) providing a resist patterned circuit-forming, board having a resist pattern formed by a resist pattern forming method, wherein the resist pattern forming method comprises the steps of:
(a) providing a photosensitive element, comprising a support, and a photosensitive resin composition layer comprising a photosensitive resin composition formed on the support, wherein the photosensitive resin composition comprises
(1) a binder polymer;
(2) a photopolymerizing compound with at least one polymerizable ethylenic unsaturated group in the molecule; and
(3) a photopolymerization initiator, wherein component (B) contains a compound represented by the following general formula (I), (I)

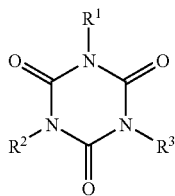

wherein in formula (I) $R^1$, $R^2$ and each $R^3$ each independently represent a group represented by the following general formula (II), (II)

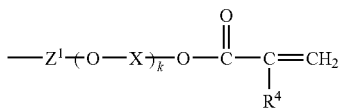

wherein in formula (II) $R^4$ represents hydrogen or methyl, X represents C2-6 alkylene, and k represent an integer of 1-30, or wherein in formula (I) $R^1$, $R^2$ and $R^3$ each independently represent a group represented by the following general formula (III), (III)

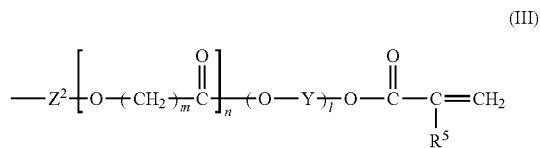

wherein in formula (III) $R^5$ represents hydrogen or methyl, Y represents C2-6 alkylene, m, represents an integer of 1-10, n represents an integer of 1-10, and 1 represents an integer 1,
wherein at least one from $R^1$, $R^2$ and $R^3$ is a group represented by general formula (III),
wherein $Z^1$ in formula (II) and $Z^2$ in formula (III) each independently represent a divalent group represented by the following general formulas (IV), (V) or (VI) provided below as (IV)

wherein in formula (IV) p represents an integer of 1-10, (V)

and (VI)

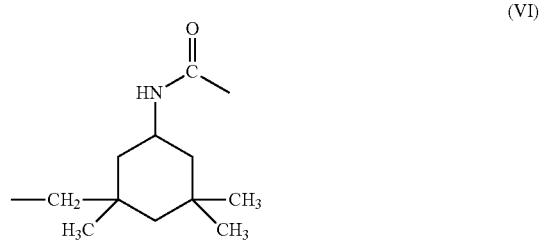

(b) laminating the photosensitive resin composition layer of the photosensitive element on a circuit-forming board, and
(c) exposing prescribed sections of the photosensitive resin composition layer to active light rays to form exposed sections, after which sections other than the exposed sections are removed, and
(ii) etching or plating the resist patterned circuit-forming board.

* * * * *